United States Patent [19]
Nanni et al.

[11] Patent Number: 5,289,141
[45] Date of Patent: Feb. 22, 1994

[54] METHOD AND APPARATUS FOR DIGITAL MODULATION USING CONCURRENT PULSE ADDITION AND SUBTRACTION

[75] Inventors: Peter Nanni, Algonquin; Bradley M. Hiben, Glen Ellyn; Leslie D. Mutz, Barrington, all of Ill.

[73] Assignee: Motorola, Inc., Schaumburg, Ill.

[21] Appl. No.: 960,150

[22] Filed: Oct. 13, 1992

[51] Int. Cl.⁵ .................. H03C 3/09; H03L 7/06; H04L 27/12

[52] U.S. Cl. .................... 332/101; 331/23; 332/127; 375/45; 375/65; 455/76; 455/110

[58] Field of Search ............ 332/100, 101, 102, 127, 332/128; 331/1 A, 18, 23, 25; 375/45, 62, 65; 455/42, 75, 76, 110

[56] References Cited

U.S. PATENT DOCUMENTS

| | | | |
|---|---|---|---|
| 4,471,328 | 9/1984 | Chapman | 332/9 R |
| 4,901,036 | 2/1990 | Herold et al. | 331/25 |
| 4,926,141 | 5/1990 | Herold et al. | 331/16 |

*Primary Examiner*—Siegfried H. Grimm
*Attorney, Agent, or Firm*—R. Louis Breeden; Thomas G. Berry; Daniel R. Collopy

[57] ABSTRACT

A method and apparatus for generating an output signal (616) having a pre-determined frequency shift relative to the frequency of a reference signal from a reference frequency generator (202) comprise a digital phase-locked loop (206) coupled to the reference signal for generating the output signal (616). The method and apparatus further comprise adding pulses to the reference signal in a pulse addition circuit (304), the pulses recurring at a first cyclical rate determined by a microprocessor (702). The method and apparatus further comprise concurrently subtracting pulses from the reference signal in a pulse subtraction circuit (302) at a second cyclical rate.

20 Claims, 6 Drawing Sheets

METHOD AND APPARATUS FOR DIGITAL MODULATION USING CONCURRENT PULSE ADDITION AND SUBTRACTION

FIELD OF THE INVENTION

This invention relates in general to modulators for radio frequency transmitters, and more specifically to a method and apparatus for digital modulation using concurrent pulse addition and subtraction.

BACKGROUND OF THE INVENTION

Conventional FM transmitters using phase-locked loops (PLLs) to generate a high frequency carrier signal having its frequency synchronized by a substantially lower frequency input reference signal are well-known in the art. An inherent characteristic of a PLL is a low-pass filter in the loop that allows the loop to track long-term, slow variation of the frequency of the input reference signal, but prevents tracking high frequency changes, such as jitter, in the input reference signal. From the point of view of modulating the output, i.e., voltage controlled oscillator (VCO), side of the PLL, the loop characteristics permit high frequency modulation of the output, e.g., voice modulation, but prevent low frequency or DC modulation such as required to transmit asymmetrical data or to do permanent carrier frequency offset. To do both high and low frequency modulation, conventional transmitters have used a two-port modulation technique that simultaneously applied a modulating signal to both the PLL VCO and to a reference modulator for modulating the input reference signal.

Conventional reference modulators have used a pulse addition technique to increase the input reference frequency, and a pulse subtraction technique to lower the input reference frequency. Because the required amount of modulation was a small fraction of the carrier frequency, the rate of pulse addition or subtraction was very low, e.g., sixty Hz. The very low pulse rate caused very low frequency spurious signals that had to be removed by the low-pass filter of the PLL to prevent the spurious signals from modulating the carrier. Adequate attenuation of the very low frequency spurious signals required an extremely low frequency cut-off, e.g., five Hz, for the low-pass filter of the PLL. Unfortunately, a five Hz PLL low-pass filter produced a PLL lock time that was too long to meet requirements for a frequency agile transmitter, i.e., a transmitter capable of being switched quickly to different pre-determined frequencies on demand.

To overcome the problem of an overly long lock time, manufacturers of conventional transmitters constructed the transmitters using two PLLs—one having a very low cut-off frequency for filtering the very low frequency spurious signals, and the other PLL having a moderate cut-off frequency for providing a sufficiently fast lock time when changing to a new frequency. While this dual PLL approach solved the lock time problem and provided DC and low frequency modulation capability, the approach was a costly one, because it doubled the number of PLLs and the space required therefor.

Thus, what is needed is a way of providing DC and low frequency modulation in an FM transmitter without a resultant overly slow PLL lock time, and without the requirement for two costly PLLs.

SUMMARY OF THE INVENTION

One aspect of the present invention comprises a method of generating an output signal having a pre-determined frequency shift relative to the frequency of a reference signal in a system comprising a digital phase-locked loop coupled to the reference signal for generating the output signal. The method comprises the steps of adding pulses to the reference signal, the pulses recurring at a first cyclical rate, and concurrently subtracting pulses from the reference signal at a second cyclical rate.

Another aspect of the present invention comprises an apparatus for generating an output signal having a pre-determined frequency shift relative to the frequency of a reference signal in a system comprising a digital phase-locked loop coupled to the reference signal for generating the output signal. The apparatus comprises a pulse adder coupled to the reference signal for adding pulses recurring at a first cyclical rate to the reference signal. The apparatus further comprises a pulse subtracter coupled to the reference signal for concurrently subtracting pulses at a second cyclical rate from the reference signal.

Another aspect of the present invention comprises a wireless communication transmitter having a frequency synthesizer for generating an output signal having a predetermined frequency shift relative to the frequency of a reference signal in the synthesizer comprising a digital phase-locked loop coupled to the reference signal for generating the output signal. The frequency synthesizer comprises a pulse adder coupled to the reference signal for adding pulses recurring at a first cyclical rate to the reference signal, and a pulse subtracter coupled to the reference signal for concurrently subtracting pulses at a second cyclical rate from the reference signal.

DESCRIPTION OF THE PREFERRED EMBODIMENT

Figure 1:
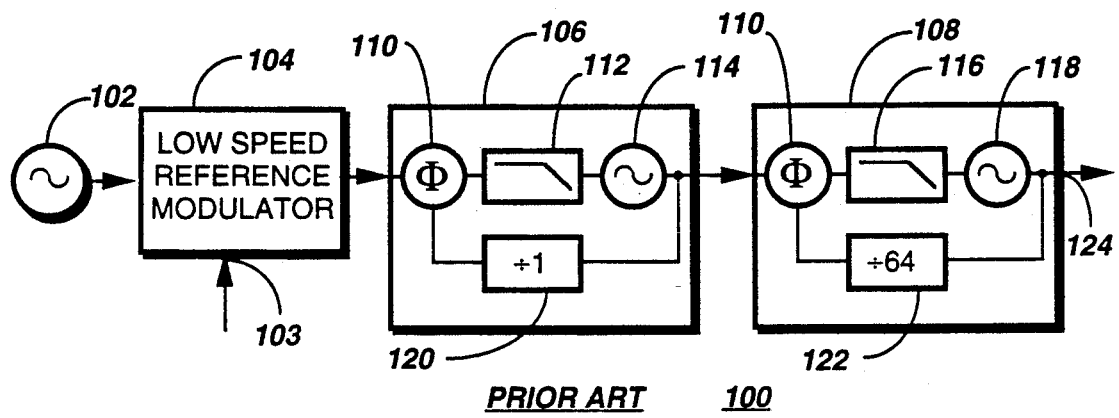
FIG. 1 is an electrical block diagram of a conventional frequency synthesizer for a frequency modulation (FM) transmitter having a conventional low speed reference modulator.

With reference to FIG. 1, an electrical block diagram of a conventional frequency synthesizer 100 having a conventional low speed reference modulator 104 for a frequency modulation (FM) transmitter comprises a reference frequency generator 102, which generates a moderately high frequency, e.g., 14.4 MHz, output signal. The output signal from the reference frequency generator 102 is coupled to the low speed reference modulator 104 for modulating the output signal in response to data symbols received at a data input 103. Because of the high carrier frequency desired at an output 124 of the frequency synthesizer 100, e.g., 921.6 MHz, frequency multiplication circuitry comprising a second phase-locked loop (PLL) 108 is coupled to the reference modulator 104. (A first PLL 106 coupled between the low speed reference modulator 104 and the second PLL 108 will be justified and discussed herein below following a discussion of the second PLL 108.)

The second PLL 108 comprises a phase comparator 110 coupled to an output signal from the low speed reference modulator 104 and to a divider 122 having a division factor, driven by the carrier frequency at the output 124 of the frequency synthesizer 100. The phase comparator 110 generates an error signal, which is coupled through a low pass filter 116 to a voltage controlled oscillator (VCO) 118 for generating the carrier frequency at the output 124. Operation of the second PLL 108 is such that the carrier frequency at the output 124 tracks the frequency of the output signal of the low speed reference modulator 104, multiplied by the division factor, e.g., 64, of the divider 122. In a frequency-agile transmitter the division factor may be adjusted to adjust the carrier frequency. For the example of a reference frequency of 14.4 MHz and a division factor of 64, the carrier frequency at the output 124 would be 921.6 MHz.

The conventional low speed reference modulator 104 operates by adding pulses into the output signal of the reference frequency generator 102 to increase the carrier frequency at the output 124 of the frequency synthesizer 100. Conversely, the conventional low speed reference modulator 104 subtracts pulses from the output signal of the reference frequency generator 102 to decrease the carrier frequency at the output 102 of the frequency synthesizer 100. Unlike the present invention, conventional reference modulators are not capable of adding and subtracting pulses concurrently. Conventional circuits and techniques for performing pulse addition and subtraction are taught in U.S. Pat. No. 4,471,328 to Chapman, which is assigned to the assignee of the present invention, and which is hereby incorporated by reference herein.

Typically the amount of frequency increase or decrease required to be done by the conventional low speed reference modulator 104 is small, e.g., a positive 4,000 Hz carrier offset, thus requiring a very low frequency rate of pulse addition or pulse subtraction. Continuing with the previous example, because of the frequency multiplication provided by the PLL 108, a positive 4,000 Hz carrier offset would require only a 62.5 Hz rate of pulse addition by the low speed reference modulator 104.

A 62.5 Hz rate of pulse addition produces not only the desired carrier frequency offset at the output 124 of the frequency synthesizer 100, but also will produce spurious 62.5 Hz modulation of the carrier frequency, if signals at the 62.5 Hz pulse addition rate are allowed to reach the VCO 118 unattenuated. Preferably, an attenuation of at least fifty dB at 62.5 Hz is required relative to the gain presented to a signal at the reference frequency of 14.4 MHz.

It would be possible to design the PLL 108 to produce the preferred attenuation of fifty dB at 62.5 Hz by designing the low pass filter 116 to have an extremely low natural loop corner frequency of approximately five Hz. Unfortunately, as discussed briefly in the background section herein above, a natural loop corner frequency of five Hz produces a lock time of 455 milliseconds—about ten times longer than is preferred for a frequency-agile transmitter.

Consequently, the conventional frequency synthesizer 100 is constructed with the two PLLs 106, 108. The low pass filter 116 of the second PLL 108 is designed with a natural loop corner frequency high enough, e.g., 50 Hz, to provide a fast enough (45.5 msec.) lock time during frequency changes effected by changing the division factor of the divider 122. The first PLL 106 is designed with a low pass filter 112 having an extremely low natural loop corner frequency, e.g., five Hz. The extremely low natural loop corner frequency of the low pass filter 112 provides the required amount of attenuation of the very low frequency pulse addition or pulse subtraction signals. A resultant long lock time of the first PLL 106 is of little consequence, because the division factor of the divider 120 is not varied to adjust the output frequency.

While the technique of using two PLLs has been able to achieve both a fast enough lock time and sufficient attenuation of the pulse addition and subtraction signals, this technique has also been costly in terms of both component cost and space requirements for accommodating the additional PLL. It would be highly desirable to find a way to achieve both a fast enough lock time and sufficient attenuation of the pulse addition and subtraction signals using a single PLL.

Figure 2:
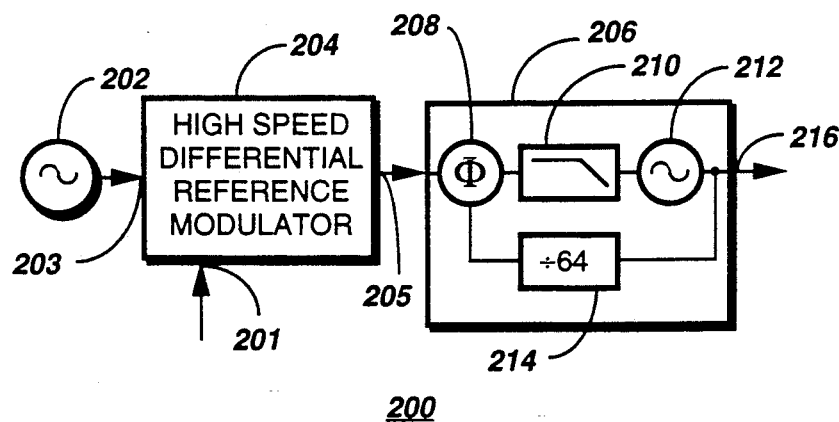
FIG. 2 is an electrical block diagram of a frequency synthesizer for an FM transmitter having a high speed differential reference modulator in accordance with the preferred embodiment of the present invention.

With reference to FIG. 2, an electrical block diagram of a frequency synthesizer 200 for an FM transmitter having a high speed differential reference modulator 204 in accordance with the preferred embodiment of the present invention comprises a reference frequency generator 202, which generates a moderately high frequency, e.g., 14.4 MHz, output signal. The output signal from the reference frequency generator 202 is coupled to an input line 203 of the high speed differential reference modulator 204 for modulating the output signal of the reference frequency generator 202 in response to data symbols received at a data input 201. Because of the high carrier frequency desired at an output 216 of the frequency synthesizer 200, e.g., 921.6 MHz, frequency multiplication circuitry comprising a phase-locked loop (PLL) 206 is coupled to the high speed differential reference modulator 204 by an output line 205 of the high speed differential reference modulator 204.

The PLL 206 comprises a phase comparator 208 coupled to the high speed differential reference modulator 204 and to a divider 214 having a division factor, driven by the carrier frequency at the output 216 of the frequency synthesizer 200. The phase comparator 208 generates an error signal, which is coupled through a low pass filter 210 to a voltage controlled oscillator (VCO) 212 for generating the carrier frequency at the output 216. Operation of the PLL 206 is such that the carrier frequency at the output 216 tracks the frequency of the output signal of the high speed differential reference modulator 204, multiplied by the division factor, e.g., 64, of the divider 214. In a frequency-agile transmitter the division factor is adjusted to adjust the carrier frequency. For the example of a reference frequency of 14.4 MHz and a division factor of 64, the carrier frequency at the output 216 would be 921.6 MHz.

While the architecture of the PLL 206 is similar to the conventional PLL 106 (FIG. 1), the natural loop corner frequency of the low pass filter 210 is substantially, e.g., ten times, higher than the natural loop corner frequency of the low pass filter 112 (FIG. 1) of the PLL 106. The substantially higher natural loop corner frequency provides a sufficiently fast lock time to allow the PLL 206 to be used alone for frequency-agile applications.

Components used in constructing the PLL 206 are preferably as follows:

| | |
|---|---|
| the phase comparator 208 | part of MC145170; |
| the divider 214 | part of MC145170; |
| the VCO 212 | TTD1732A; |
| the ref. freq. gen. 202 | KXN-1096A. |

The above components are available from Motorola, Inc., Schaumburg, Ill.

The low pass filter 210 is a discrete first order filter comprising a resistor coupled between an error signal output of the phase comparator 208 and a frequency controlling input of the VCO 212, together with a capacitor coupled between the frequency controlling input of the VCO 212 and circuit ground. Other components and circuit architectures may be used as well in accordance with the present invention.

A key component of the frequency synthesizer 200 that enables the use of the substantially higher natural loop frequency in the PLL 206 is the high speed differential reference modulator 204 in accordance with the present invention. Unlike conventional low speed reference modulators, the high speed differential reference modulator 204 does not use low frequency (near 60 Hz) pulse addition or subtraction. Instead, the high speed differential reference modulator 204 uses moderate frequency (near 600 Hz), concurrent pulse addition and subtraction.

In a conventional frequency synthesizer, the use of moderate frequency pulse addition or subtraction would produce too much change in the reference frequency, resulting in over modulation of the carrier frequency. In the frequency synthesizer 200 in accordance with the present invention, instead of using either pulse addition alone or pulse subtraction alone to increase or decrease the reference frequency, the high speed differential reference modulator 204 uses both pulse addition and pulse subtraction concurrently. Because pulse addition and pulse subtraction have opposite effects on the reference frequency, the concurrent use of moderate-frequency pulse addition and subtraction produces less change in the reference frequency than is the case for pulse addition or pulse subtraction used alone. This is because the arithmetic difference between the frequency of pulse addition and the frequency of pulse subtraction determines the amount of change in the reference frequency.

To increase the reference frequency by an amount $\Delta f$, the high speed differential reference modulator 204 uses a moderate frequency, e.g., six-hundred Hz, of pulse addition while concurrently using a frequency of pulse subtraction $\Delta f$ lower than the moderate frequency of pulse addition. To decrease the reference frequency by the amount $\Delta f$, the high speed differential reference modulator 204 uses a moderate frequency of pulse addition while concurrently using a frequency of pulse subtraction $\Delta f$ higher than the moderate frequency of pulse addition.

While the overall operational concept of the high speed differential reference modulator 204 appears simple enough, there are some operational details that must be addressed for the high speed differential reference modulator 204 to perform correctly. The first of these operational details is the selection of the pulse addition and subtraction frequencies. The lower of the two frequencies preferably must be selected to be high enough to be attenuated sufficiently, e.g., 50 dB, by the low pass filter 210 of the PLL 206. For example, if the low pass filter 210 develops 50 dB of attenuation at five-hundred Hz, then the pulse addition and pulse subtraction frequencies must both be higher than five-hundred Hz.

As indicated herein above, the arithmetic difference between the pulse addition and pulse subtraction frequencies equals the change in the reference frequency. For example, if a fifty-Hz reference frequency increase is desired and the minimum pulse addition or subtraction frequency is five-hundred Hz, then one set of appropriate choices is five-hundred Hz for the pulse subtraction rate and five-hundred-fifty Hz for the pulse addition rate. Many other equally appropriate sets of choices exist, e.g., six-hundred-thirty Hz for the pulse subtraction rate and six-hundred-eighty Hz for the pulse addition rate, although there is little advantage in increasing the rates much above the minimum required for adequate attenuation by the low pass filter 210.

A second, and somewhat more complex, operational detail that affects the selection of the pulse addition and subtraction frequencies is that the addition of a pulse must be prevented from occurring simultaneously with the subtraction of a pulse, otherwise an indeterminate result may be produced. One method of assuring that pulse addition and subtraction will not occur simultaneously is to chose the addition and subtraction frequencies so that the relative phase between the two frequencies repeats cyclically, as is explained herein below. In addition, the initial phase between signals comprising the pulse addition and subtraction frequencies must be offset such that each pulse addition occurs at a time different from the time of each pulse subtraction.

Defining the pulse addition signal to have a periodic waveform of frequency FA and the pulse subtraction signal to have a periodic waveform of frequency FS, the degrees of phase transversed between the two waveforms per cycle of FS is:

$$\Delta\Theta/\text{CYCLE} = 360 \times \frac{FA - FS}{FS} = 360 \times \left(\frac{FA}{FS} - 1\right).$$

To guarantee cyclic phase repetition, 360 degrees must be an integer multiple of $\Delta\Theta/\text{CYCLE}$:

$$\Delta\Theta/\text{CYCLE} = \frac{360}{n}, n = \text{integer}.$$

In terms of FA and FS, $$360 \times \left(\frac{FA}{FS} - 1\right) = \frac{360}{n}, \text{ or} \quad \text{(Constraint 1)}$$

$$\frac{FA}{FS} = \frac{1}{n} + 1.$$

For a given required positive reference frequency deviation $\Delta f$, $$FA - FS = \Delta f. \quad \text{(Constraint 2)}$$

Combining constraints 1 and 2, for positive deviation:

$$FS = n \times \Delta f, \text{ and } FA = (n+1) \times \Delta f.$$

For a given required negative reference frequency deviation $\Delta f$, $$FS - FA = \Delta f. \quad \text{(Constraint 3)}$$

Combining constraints 1 and 3, for negative deviation:

$$FS = (n+1) \times \Delta f, \text{ and } FA = n \times \Delta f.$$

Finally, to offset the initial phase between the signals comprising the pulse addition and subtraction frequencies such that each pulse addition occurs as far as possible from each pulse subtraction, the offset value must be:

$$\lambda = \frac{\Delta\Theta/\text{CYCLE}}{2} = \frac{180}{n} \text{ degrees},$$

for modulators adding or subtracting pulses on either a positive or a negative edge of the signals (but not both edges), or $$\lambda = \frac{\Delta\Theta/\text{CYCLE}}{4} = \frac{90}{n} \text{ degrees},$$

for modulators adding or subtracting pulses on both positive and negative edges of 50%-duty-cycle signals. (Constraint 4).

Calculations based upon the preceding constraints follow for an example transmitter.
  Assumptions:
  Carrier frequency = 930 MHz
  Desired carrier frequency deviation = +4 KHz
  Reference frequency = 14.4 MHz
  Synth. loop freq. for 50 dB attenuation = 500 Hz
  Modulator adds/subtracts pulses on both pos/neg edges of 50% duty cycle signals.
  Calculations:
  Reference freq. deviation:

$$\Delta f = 4 \text{ kHz} \times \frac{14.4 \text{ MHz}}{930 \text{ MHz}} = 62 \text{ Hz}.$$

$$FS = n \times \Delta f \leq 500 \text{ Hz}; \therefore n(\min) = 9.$$

$$FS = 558 \text{ Hz}; FA = 620 \text{ Hz}.$$

Initial phase offset:

$$\lambda = \frac{90}{n} = \frac{90}{9} = 10 \text{ degrees}.$$

Two periodic pulse trains at 558 Hz applied to a pulse subtraction port and at 620 Hz initially phase-offset by ten degrees and applied to a pulse addition port of a pulse sync circuit within the high speed differential reference modulator 204 will increase the carrier frequency of the example transmitter by 4.00 KHz, while attenuating pulse spurs by at least fifty dB.

Figure 3:
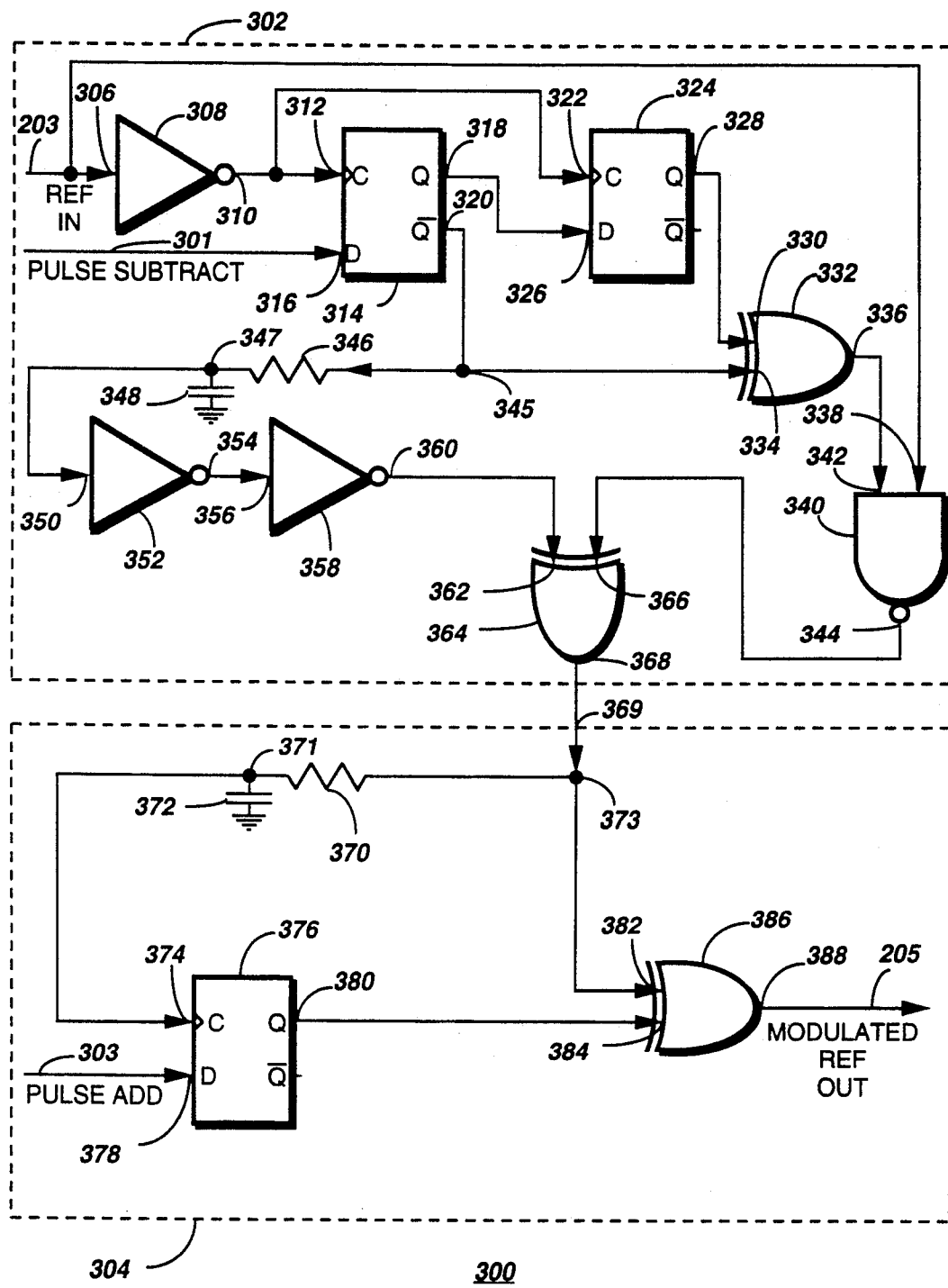
FIG. 3 is an electrical block diagram of a pulse sync circuit used in the high speed differential reference modulator in accordance with the preferred embodiment of the present invention.

With reference to FIG. 3, an electrical block diagram of a pulse sync circuit 300 used in the high speed differential reference modulator 204 in accordance with the preferred embodiment of the present invention comprises a pulse subtraction circuit 302 and a pulse addition circuit 304. The pulse sync circuit 300 receives an input signal from the reference frequency generator 202 (FIG. 2), which is coupled to the input line 203. The pulse sync circuit 300 provides a modulated reference signal on the output line 205. Two control lines, a pulse subtract line 301 and a pulse add line 303 are coupled to a microprocessor 702 (FIG. 7) for controlling the pulse sync circuit 300, as described in detail herein below.

First, the components and connections of the pulse subtraction circuit 302 will be described. The input line 203 serves as subtracter input of the high speed differential reference modulator 204 and is coupled to input 306 of a first inverter 308 and to a first input 338 of a NAND gate 340. The pulse subtract line 301 is coupled to D input 316 of a first D Flip-Flop 314. Output 310 of the first inverter 308 is coupled to clock input 312 of the first D Flip-Flop 314 and to clock input 322 of a second D Flip-Flop 324. Q output 318 of the first D Flip-Flop 314 is coupled to D input 326 of the second D Flip-Flop 324, while $\overline{Q}$ output 320 of the first D Flip-Flop 314 is coupled to a first node 345. The first node 345 is coupled to a first input 334 of a first Exclusive OR gate 332. Q output 328 of the second D Flip-Flop 324 is coupled to a second input 330 of the first Exclusive OR gate 332. $\overline{Q}$ output of the second D Flip-Flop 324 is not used. A first resistor 346 is coupled between the first node 345 and a second node 347. A first capacitor 348 is coupled between the second node 347 and circuit ground. The second node 347 is also coupled to input 350 of a second inverter 352, whose output 354 is coupled to input 356 of a third inverter 358. Output 360 of the third inverter 358 is coupled to a first input 362 of a second Exclusive OR gate 364. Output 336 of the first Exclusive OR gate 332 is coupled to a second input 342 of the NAND gate 340, whose output 344 is coupled to a second input 366 of the second Exclusive OR gate 364. Output 368 of the second Exclusive OR gate 364 comprises the subtracter output of the pulse subtraction circuit 302, and is coupled to an adder input line 369 of the pulse addition circuit 304.

Next, the components and connections of the pulse addition circuit 304 will be described. The adder input line 369 is coupled to a third node 373, which is also coupled to a first input 382 of a third Exclusive OR gate 386. A second resistor 370 is coupled between the third node 373 and a fourth node 371. A second capacitor 372 is coupled between the fourth node 371 and circuit ground. The fourth node 371 also is coupled to clock input 374 of a third D Flip-Flop 376. The pulse add line 303 is coupled to D input 378. Q output 380 of the third D Flip-Flop 376 is coupled to a second input 384 of the third Exclusive OR gate 386. $\bar{Q}$ output of the third D Flip-Flop 376 is not used. Output 388 of the third Exclusive OR gate 386 serves as the adder output from the pulse addition circuit 304 and, in fact, as the output of the high speed differential reference modulator 204 (FIG. 2), and thus is coupled to the output line 205 of the high speed differential reference modulator 204.

The signal path through the pulse sync circuit 300 for the input signal from the reference frequency generator 202 (FIG. 2) is from the input line 203, through the NAND gate 340, through the second Exclusive OR gate 364, and through the third Exclusive OR gate 386 to the output line 205. In a quiescent state when both the pulse subtract line 301 and the pulse add line 303 are at a low logic level, all the D Flip-Flops 314, 324, 376 are reset (Q low, $\bar{Q}$ high). The output 336 of the first Exclusive OR 332 is thus high, enabling the signal path through the NAND gate 340, which inverts the input signal. The first input 362 of the second Exclusive OR gate 364 is high, thus causing the second Exclusive OR gate 364 to invert the input signal again, restoring the original phase. The second input 384 of the third Exclusive OR gate 386 is low, thus allowing the third Exclusive OR gate 386 to pass the input signal without inversion. Thus, in the quiescent state the input signal appears at the output line 205 exactly as the input signal arrived at the input line 203.

Figure 4:
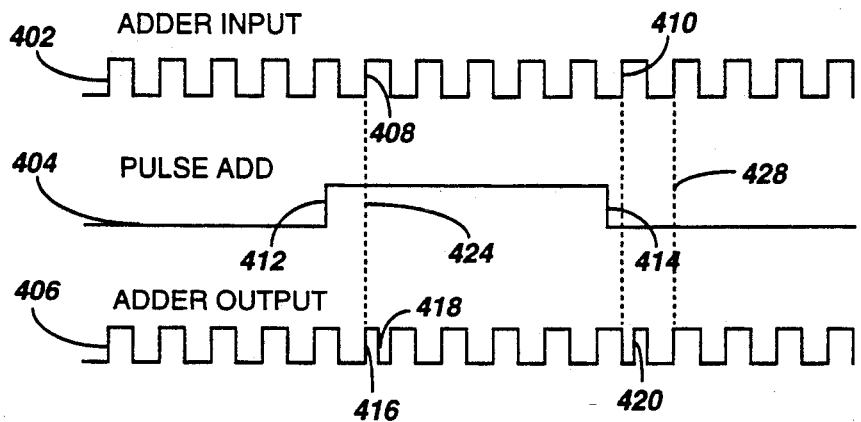
FIG. 4 is a timing diagram depicting the operation of a pulse adder circuit used in the pulse sync circuit in accordance with the preferred embodiment of the present invention.

With reference to FIG. 4, a timing diagram depicting the operation of the pulse addition circuit 304 used in the pulse sync circuit 300 (FIG. 3) in accordance with the preferred embodiment of the present invention will help explain the operation of the pulse addition circuit 304 when the pulse add line 303 moves from low to high, and then back to low. The reader should note that during the following discussion all 300-series reference numbers refer to items of FIG. 3, while all 400-series reference numbers refer to items of FIG. 4.

FIG. 4 depicts the amplitude (on a vertical axis) versus time (on a horizontal axis) of an adder input signal 402 on the adder input line 369, a pulse add signal 404 on the pulse add line 303, and an adder output signal 406 on the output line 205 (FIGS. 2, 3). The adder input signal 402 comprises a moderately high frequency, e.g., 14.4 MHz, substantially square waveform. Initially, in FIG. 4 the pulse add signal 404 is low. In this state, the adder output signal 406 substantially matches and is in phase with the adder input signal 402.

At point 412 the pulse add signal 404 transitions to high, providing the D input 378 of the third D Flip-Flop 376 with a high signal. Nothing of further significance happens until at point 408 the adder input signal 402 transitions from low to high. The transition propagates through the second resistor 370, charging the second capacitor 372. The second resistor 370 and capacitor 372 interact to delay the appearance of the transition to high at the clock input 374 of the third D Flip-Flop 376. Preferably, the second resistor 370 and capacitor 372 values are such that they produce a delay substantially equal to one-quarter period of the adder input signal 402. For an adder input signal 402 of 14.4 MHz, for example, values of 100.0 ohms and 62.0 picofarads for the second resistor 370 and capacitor 372, respectively, are preferable.

When the transition to high has propagated to the clock input 374 of the third D Flip-Flop 376, the Q output 380 goes high, thus causing the third Exclusive OR gate 386 to begin inverting the adder input signal 402. This action returns the adder output signal 406 to a low level at point 418. From that point on, as long as the pulse add signal 404 remains high, the third Exclusive OR gate 386 continues to track the adder input signal 402, but with inverted phase.

At point 414 the pulse add signal 404 transitions back to low, providing the D input 378 of the third D Flip-Flop 376 with a low signal. Nothing of further significance happens until at point 410 the adder input signal 402 transitions from low to high. As before, the transition propagates through the delay provided by the second resistor 370 charging the second capacitor 372.

When the transition of the adder input signal 402 to high has propagated to the clock input 374 of the third D Flip-Flop 376, the Q output 380 goes low, thus causing the third Exclusive OR gate 386 to stop inverting the adder input signal 402. This action returns the adder output signal 406 to a high level at point 420. From that point on, as long as the pulse add signal 404 remains low, the third Exclusive OR gate 386 continues to track the adder input signal 402 without phase inversion.

If one counts the number of pulses occurring between the dashed line 424 at the beginning of modification of the adder output signal 406, and the dashed line 428 at the end of modification of the adder output signal, one finds six pulses in the adder input 402 and seven pulses in the adder output 406. Thus, the net effect of each full low-high-low transition of the pulse add signal 404 is to add one pulse more to the adder output signal 406 than the adder output signal 406 would have contained without the low-high-low transition of the pulse add signal 404. Stated another way, each transition of the pulse add signal 404 (low-high or high-low) adds one-half pulse to the adder output signal 406.

Figure 5:
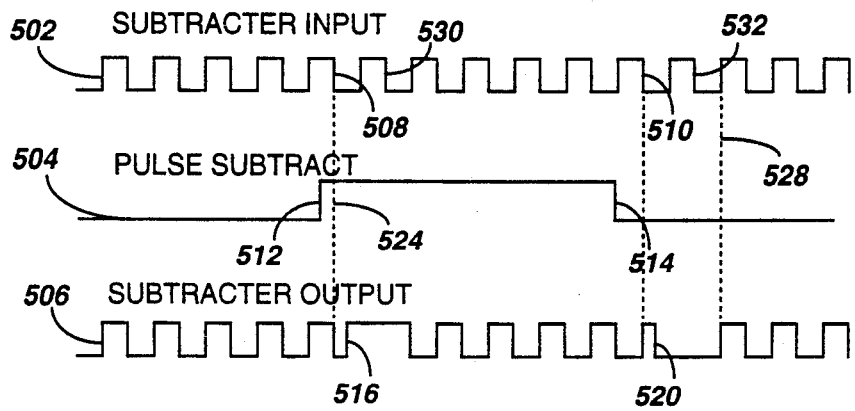
FIG. 5 is a timing diagram depicting the operation of a pulse subtracter circuit used in the pulse sync circuit in accordance with the preferred embodiment of the present invention.

With reference to FIG. 5, a timing diagram depicting the operation of the pulse substraction circuit 302 (FIG. 3) used in the pulse sync circuit 300 (FIG. 3) in accordance with the preferred embodiment of the present invention will help explain the operation of the pulse substraction circuit 302 when the pulse subtract line 303 moves from low to high, and then back to low. The reader should note that during the following discussion all 300-series reference numbers refer to items of FIG. 3, while all 500-series reference numbers refer to items of FIG. 5.

FIG. 5 depicts the amplitude (on a vertical axis) versus time (on a horizontal axis) of a subtracter input signal 502 on the input line 203 (FIGS. 2, 3), a pulse subtract signal 504 on the pulse subtract line 301, and a subtracter output signal 506 at the output 368 of the second Exclusive OR gate 364. The subtracter input signal 502 comprises a moderately high frequency, e.g., 14.4 MHz, substantially square waveform. Initially, in FIG. 5 the pulse subtract signal 504 is low. In this state, the subtracter output signal 506 substantially matches and is in phase with the subtracter input signal 502.

At point 512 the pulse subtract signal 504 transitions to high, providing the D input 316 of the first D Flip-Flop 314 with a high signal. Nothing of further significance happens until at point 508 the subtracter input signal 502 transitions from high to low. The transition propagates through the first inverter 308 and clocks the first D Flip-Flop, causing the Q output 318 to go high, and the $\overline{Q}$ output 320 to go low. The second D Flip-Flop 324 also receives a high transition at its clock input 322, but remains reset (Q low, $\overline{Q}$ high) because the signal at the D input 326 was low at the time of the high transition at the clock input 322. Because both inputs 330, 334 of the first Exclusive OR gate 332 are now low, the output 336 goes low, thus forcing the output 344 of the NAND gate 340 to go high, regardless of the state of the subtracter input signal 502 at the first input 338.

The high-to-low transition of the $\overline{Q}$ output 320 propagates through the first resistor 346, charging the first capacitor 348. The first resistor 346 and capacitor 348 interact to delay the appearance of the transition to low at the first input 362 of the second Exclusive OR gate 364. Preferably, the first resistor 346 and capacitor 348 values are such that they produce a delay substantially equal to one-quarter period of the subtracter input signal 502. For a subtracter input signal 502 of 14.4 MHz, for example, values of 220.0 ohms and 62.0 picofarads for the first resistor 346 and capacitor 348, respectively, are preferable.

When the transition of the $\overline{Q}$ output 320 to low has propagated to the first input 362 of the second Exclusive OR gate 364, the subtracter output signal 506 at the output 368 goes high at point 516. On the next high-to-low transition of the subtracter input signal 502 at point 530 the second D Flip-Flop 320 is set, thus transitioning the Q output 328 to high. This signal at the second input 330 of the first Exclusive OR gate 332, together with the low present at the first input 334, causes the output 336 to go high, thus reenabling the NAND gate 340 to pass the subtracter input signal 502. Because of the low state of the first input 362 of the second Exclusive OR gate 364, the subtracter output signal 506 is now inverted compared to the subtracter input signal 502. As long as the pulse subtract signal 504 remains high, the pulse subtraction circuit 302 continues to track the subtracter input signal with inverted phase.

At point 514 the pulse subtract signal 504 transitions back to low, providing the D input 316 of the first D Flip-Flop 314 with a low signal. Nothing of further significance happens until at point 510 the subtracter input signal 502 transitions from high to low. The transition propagates through the first inverter 308 and clocks the first D Flip-Flop, causing the Q output 318 to go low, and the $\overline{Q}$ output 320 to go high. The second D Flip-Flop 324 also receives the high transition at its clock input 322, but remains set (Q high, $\overline{Q}$ low) because the signal at the D input 326 was high at the time of the high transition at the clock input 322. Because both inputs 330, 334 of the first Exclusive OR gate 332 are now high, the output 336 goes low, thus forcing the output 344 of the NAND gate 340 to go high, regardless of the state of the subtracter input signal 502 at the first input 338.

The low-to-high transition of the $\overline{Q}$ output 320 propagates through the first resistor 346, charging the first capacitor 348. As before, the first resistor 346 and capacitor 348 interact to delay the appearance of the transition to high at the first input 362 of the second Exclusive OR gate 364.

When the transition of the $\overline{Q}$ output 320 to high has propagated to the first input 362 of the second Exclusive OR gate 364, the subtracter output signal 506 at the output 368 goes low at point 520. On the next high-to-low transition of the subtracter input signal 502 at point 532 the second D Flip-Flop 320 is reset, thus transitioning the Q output 328 to low. This signal at the second input 330 of the first Exclusive OR gate 332, together with the high now present at the first input 334, causes the output 336 to go high, thus reenabling the gate 340 to pass the subtracter input signal 502. Because of the now high state of the first input 362 of the second Exclusive OR gate 364, the subtracter output signal 506 is now back in phase with the subtracter input signal 502. As long as the pulse subtract signal 504 remains low, the pulse subtraction circuit 302 continues to track the subtracter input signal in phase.

If one counts the number of pulses occurring between the dashed line 524 at the beginning of modification of the subtracter output signal 506, and the dashed line 528 at the end of modification of the subtracter output signal, one finds seven pulses in the subtracter input 502 and six pulses in the subtracter output 506. Thus, the net effect of each full low-high-low transition of the pulse subtract signal 504 is to subtract one pulse from the subtracter output signal 506 compared to what the subtracter output signal 506 would have contained without the low-high-low transition of the pulse subtract signal 504. Stated another way, each transition of the pulse subtract signal 504 (low-high or high-low) subtracts one-half pulse from the subtracter output signal 506.

Two additional conditions are preferable for enabling the pulse sync circuit 300 to function correctly. First, the duration of each transition of either the pulse add signal 404 (FIG. 4) or the pulse subtract signal 504 must be long enough for the pulse sync circuit 300 to complete the addition or subtraction of a pulse in response to the transition. Minimum transition duration for pulse addition is 1.5 times the period of the adder input signal 402 (FIG. 4), while minimum transition duration for pulse subtraction is 2.5 times the period of the subtracter input signal 502. Meeting those minimum durations typically does not present a problem, because the frequency of the pulse add and subtract signals 404, 504 is usually about 500 Hz, while the frequency of the adder and subtracter inputs 402, 502 is typically about 14.4 MHz.

The second condition preferable for the pulse sync circuit 300 to function correctly is that a pulse addition and a pulse subtraction must not occur simultaneously. That is, the frequencies and initial phase offset of the pulse add and subtract signals 404, 504 must be selected such that they meet the constraints for cyclic phase repetition and phase offset outlined herein above.

Figure 6:
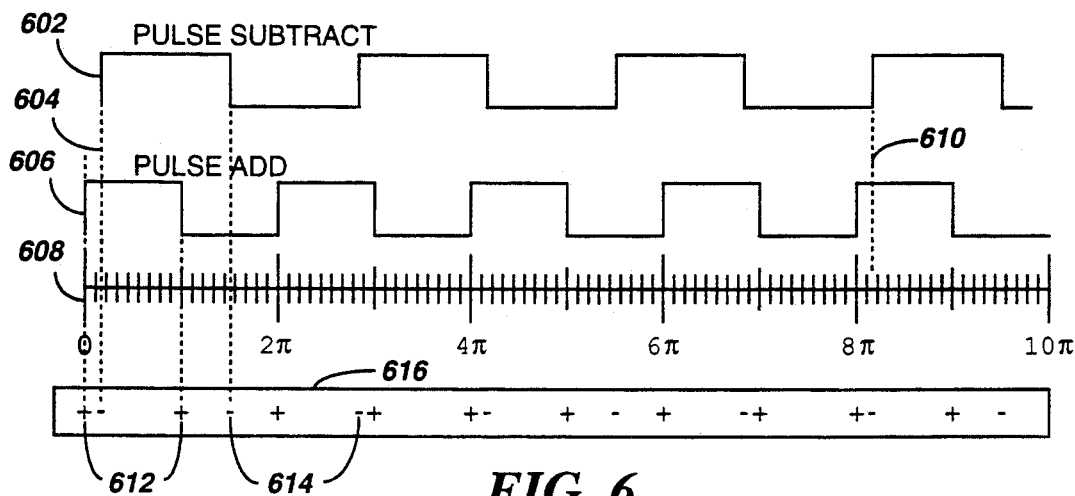
FIG. 6 is a timing diagram depicting pulse subtract and pulse add signals meeting required frequency and initial phase offset constraints in accordance with the preferred embodiment of the present invention.

With reference to FIG. 6, a timing diagram depicts a pulse subtract signal 602 and a pulse add signal 606 meeting required frequency and initial phase offset constraints in accordance with the preferred embodiment of the present invention. A horizontal scale 608 depicts the phase traversed in time by the pulse add signal 606. The pulse add signal 606 is higher in frequency than the pulse subtract signal 602, traversing an additional 120.0 degrees of phase for every cycle of the pulse subtract signal 602. The relative phase traversed between the pulse subtract signal 602 and the pulse add signal 606 is an integer divisor (N=3) of 360.0 degrees, thus cyclic phase repetition occurs every three cycles of the pulse subtract signal 602, as shown by the dashed lines 604, 610.

The rectangle 616 represents an envelope of a high frequency, e.g., 14.4 MHz, reference signal being modulated by the pulse sync circuit 300 in response to the pulse subtract signal 602 and the pulse add signal 606.

The + symbols, e.g., the symbols 612, indicate the points at which the pulse sync circuit 300 adds one-half pulse to the reference signal, while the − symbols, e.g., the symbols 614, indicate the points at which the pulse sync circuit 300 subtracts one-half pulse from the reference signal. It is important to note that the constraints according to the present invention and discussed herein above prevent pulse addition and subtraction from occurring at the same time, as confirmed by FIG. 6.

Operation of the pulse sync circuit 300 (FIG. 3) occurs on both the low-high and the high-low transitions of the pulse add and subtract signals 602, 604. For this reason, an initial phase offset of 90.0/3 = 30.0 degrees was used between the pulse add and subtract signals 602, 604. This phase offset is shown also by the dashed lines 604, 610 located at cyclic phase repetition points between the pulse add and pulse subtract signals 602, 606.

Components used for constructing the pulse sync circuit 300 are preferably as follows:

| | |
|---|---|
| the inverters 308, 352, 358 | MC74HC04 |
| the D Flip-Flops 314, 324, 376 | MC74HC74 |
| the Exclusive OR gates 332, 364, 386 | MC74HC86 |
| the NAND gate 340 | MC74HC00. |

The above components are available from Motorola, Inc., Schaumburg, Ill. Other components and circuit architectures may be used as well in accordance with the present invention.

Figure 7:
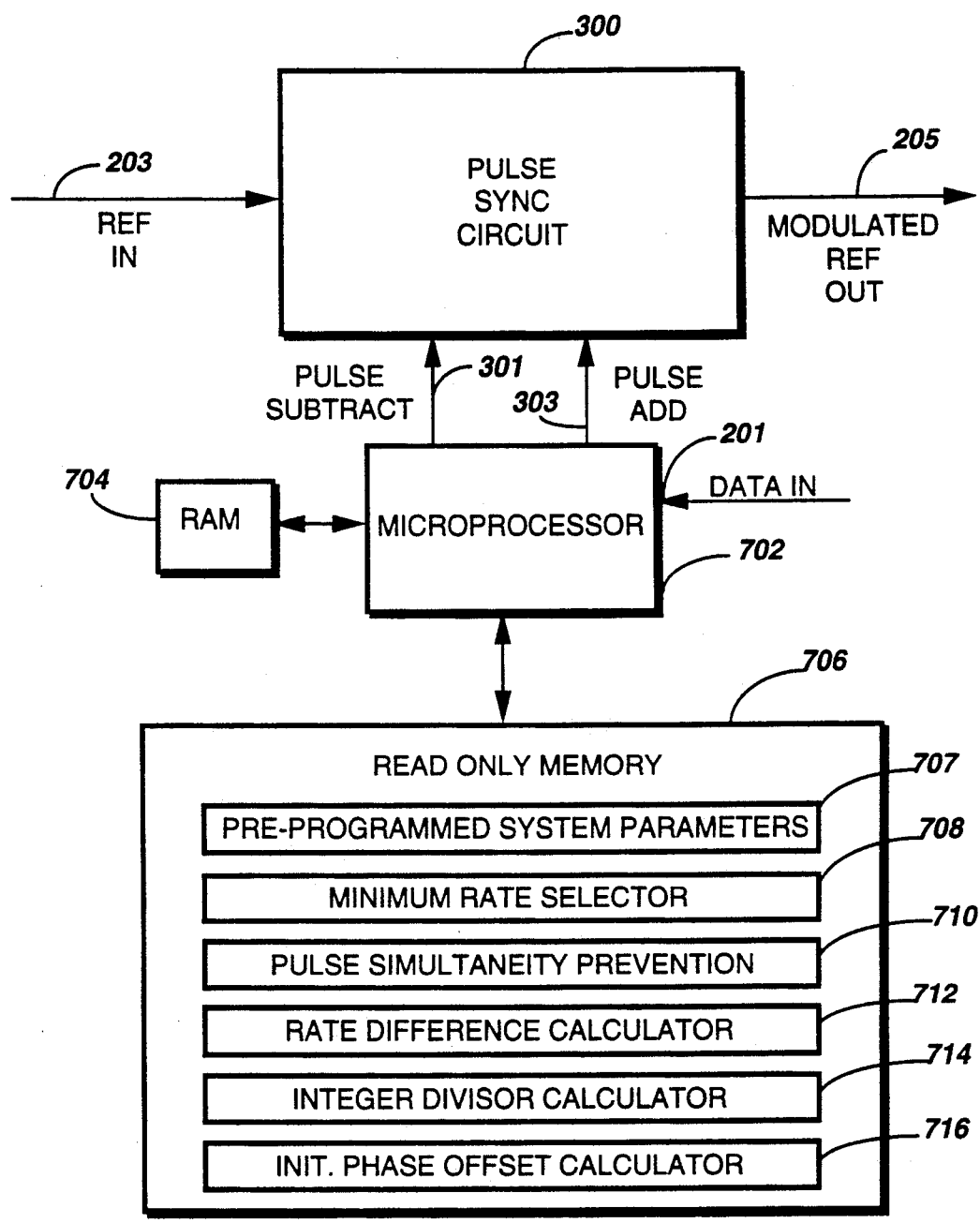
FIG. 7 is an electrical block diagram of the high speed differential reference modulator in accordance with the preferred embodiment of the present invention.

With reference to FIG. 7 an electrical block diagram of the high speed differential reference modulator 204 in accordance with the preferred embodiment of the present invention comprises the pulse sync circuit 300 coupled to a microprocessor 702, such as a microprocessor from the MC68HC11 family, available from Motorola, Inc., Schaumburg, Ill. The microprocessor 702 controls the pulse sync circuit 300 by the pulse subtract line 301 and the pulse add line 303 in accordance with the constraints described herein above in response to data signals received on the data input 201. The microprocessor 702 is coupled to a conventional random access memory (RAM) for temporarily storing values computed during operation and to a conventional read only memory (ROM) 706 comprising operating software and system constants.

The ROM 706 further comprises pre-programmed system parameters 707, e.g., carrier frequency, reference frequency, desired frequency deviation, etc. The ROM 706 also comprises a minimum rate selection element 708 for determining a minimum pulse rate compatible with desired attenuation characteristics. The ROM 706 further comprises a pulse simultaneity prevention element 710 for preventing pulse addition and pulse subtraction from occurring at the same time. Also included in the ROM 706 are a rate difference calculator 712, an integer divisor calculator 714, and an initial phase offset calculator 716, all for ensuring that the required constraints are met for proper operation of the high speed differential reference modulator 204.

Figure 8:
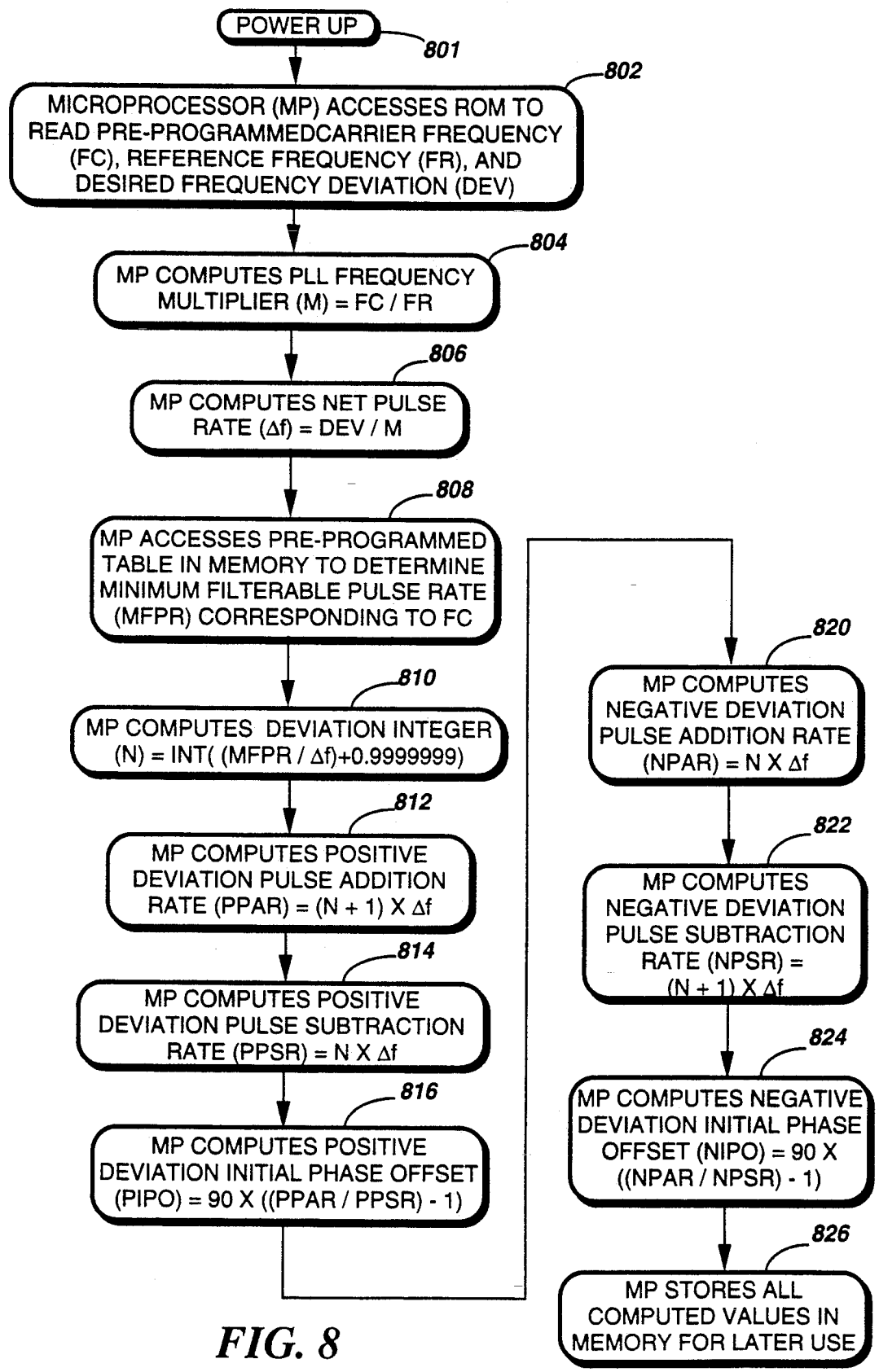
FIG. 8 is a flow chart of a power-up initialization routine for the high speed differential reference modulator in accordance with the preferred embodiment of the present invention.

With reference to FIG. 8, a flow chart of a power-up initialization routine for the high speed differential reference modulator 204 (FIG. 7) in accordance with the preferred embodiment of the present invention begins with a power up 801. In response, the microprocessor 702 (FIG. 7) accesses 802 the ROM 706 (FIG. 7) to read a pre-programmed carrier frequency value (FC), a reference frequency value (FR), and desired frequency deviation (DEV) to be used for a received data symbol. For simplicity, in the following discussion the high speed differential reference modulator 204 uses single-level FSK modulation. Alternate embodiments using multi-level FSK would perform as well with additional parameters calculated and stored for each additional level of modulation.

Next, the microprocessor 702 (FIG. 7) computes 804 the phase-locked loop (PLL) frequency multiplier (M) = FC/FR. Then the microprocessor 702 accesses the rate difference calculator 712 (FIG. 7) to compute 806 the net pulse rate ($\Delta f$) = DEV/M. Then the microprocessor 702 accesses 808 a table of values in the minimum rate selection element 708 (FIG. 7) to determine the minimum filterable pulse rate (MFPR) corresponding to FC. Next, the microprocessor 702 accesses 810 the integer divisor calculator 714 to determine a deviation integer (N) = INT((MFPR/$\Delta f$) + 0.9999999), i.e., N equals the ratio (MFPR/$\Delta f$), rounded up to the next higher integer.

After determining N, the microprocessor 702 accesses the pulse simultaneity prevention element 710 and computes 812 a positive deviation pulse addition rate (PPAR) = (N+1) × $\Delta f$. Then the microprocessor 702 computes 814 a positive deviation pulse subtraction rate (PPSR) = N × $\Delta f$. As a final computation of a positive deviation parameter, the microprocessor 702 accesses the initial phase offset calculator 716 and computes 816 a positive deviation initial phase offset (PIPO) = 90 × ((PPAR/PPSR) − 1) degrees.

Next, the microprocessor 702 (FIG. 7) must compute the parameters associated with a negative frequency deviation. First the microprocessor 702 accesses the pulse simultaneity prevention element 710 (FIG. 7) and computes 820 a negative deviation pulse addition rate (NPAR) = N × $\Delta f$. Then the microprocessor 702 computes 822 a negative deviation pulse subtraction rate (NPSR) = (N+1) × $\Delta f$. As a final computation for a negative deviation parameter, the microprocessor 702 accesses the initial phase offset calculator 716 and computes 824 a negative deviation initial phase offset (NIPO) = 90 × ((NPAR/NPSR) − 1) degrees. As a last initialization step, the microprocessor 702 stores 826 all computed values in the RAM 704 (FIG. 7) for later use.

Figure 9:
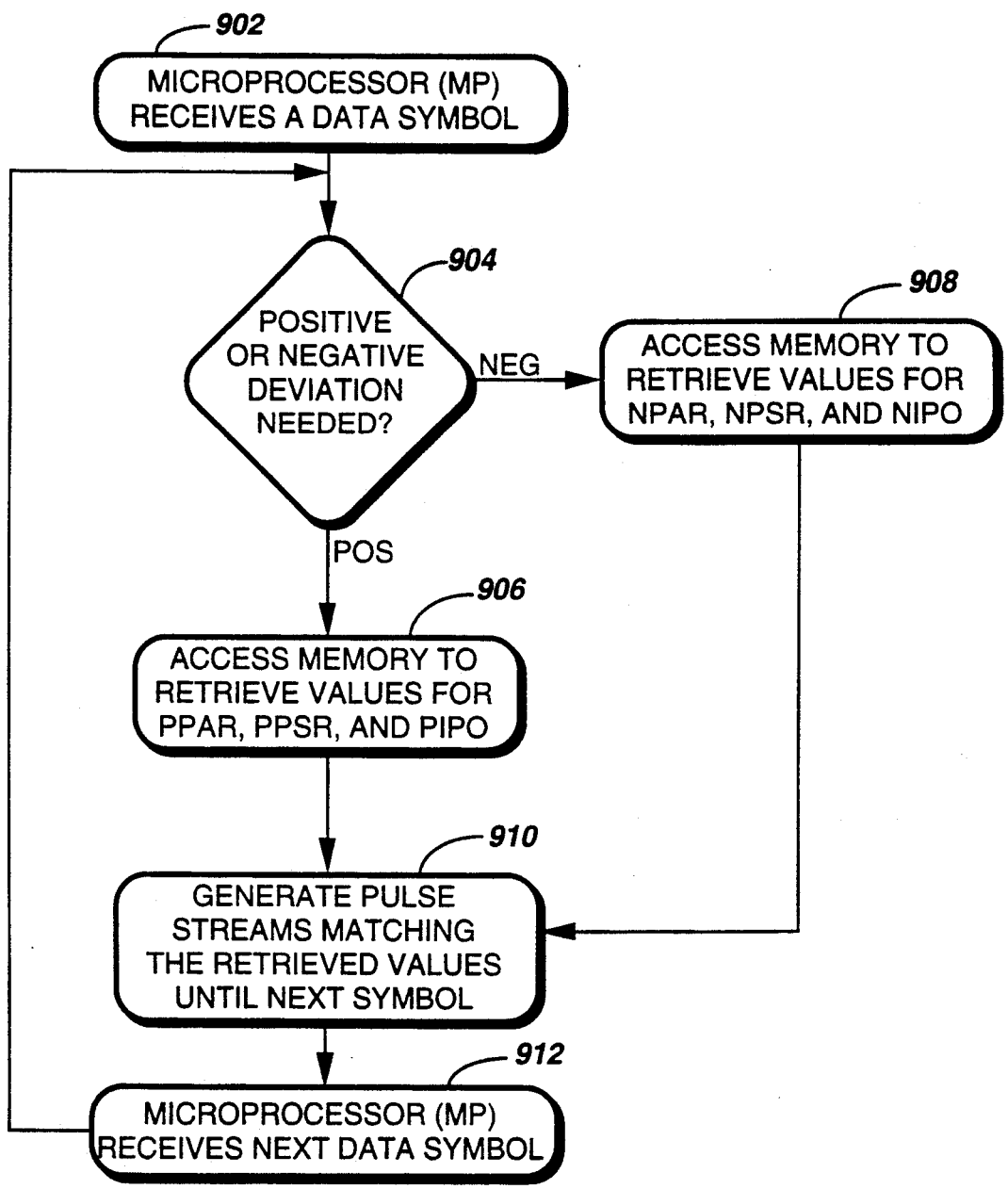
FIG. 9 is a flow chart of the operation of the high speed differential reference modulator in response to receiving a data symbol in accordance with the preferred embodiment of the present invention.

With reference to FIG. 9, a flow chart of the operation of the high speed differential reference modulator in response to receiving a data symbol in accordance with the preferred embodiment of the present invention begins with the microprocessor 702 (FIG. 7) receiving 902 the data symbol. Next, the microprocessor 702 determines 904 whether the carrier deviation required by the data symbol is positive or negative. If positive, the microprocessor 702 accesses 906 the RAM 704 (FIG. 7) to retrieve the values for the positive deviation pulse addition rate (PPAR), the positive deviation pulse subtraction rate (PPSR), and the positive deviation initial phase offset (PIPO). Next, the microprocessor 702 applies 910 pulse add and pulse subtract signals matching the retrieved values to the pulse add line 303 (FIGS. 3, 7) and to the pulse subtract line 301 (FIGS. 3, 7), respectively, in accordance with the present invention. When a next data symbol arrives 912, the microprocessor 702 returns the process to step 904.

If, on the other hand, in step 904 the microprocessor 702 (FIG. 7) determines that the required deviation is negative, then the microprocessor 702 accesses 906 the RAM 704 (FIG. 7) to retrieve the values for the negative deviation pulse addition rate (NPAR), the negative deviation pulse subtraction rate (NPSR), and the negative deviation initial phase offset (NIPO). Next, the microprocessor 702 applies 910 pulse add and pulse subtract signals matching the retrieved values to the pulse add line 303 (FIGS. 3, 7) and to the pulse subtract line 301 (FIGS. 3, 7), respectively, in accordance with the present invention. When a next data symbol arrives 912, the microprocessor 702 returns the process to step 904.

Thus, the present invention provides DC and low frequency modulation in an FM transmitter without a resultant overly slow PLL lock time, and without the requirement for two costly PLLs. By concurrently adding pulses to and subtracting pulses from a reference signal, the present invention allows the use of moderate-frequency pulse rates without over modulating the FM transmitter. The moderate-frequency pulse rates can be filtered easily by a standard low pass filter in a phase-locked loop of the FM transmitter, without requiring an extremely low natural loop corner frequency and a resultant overly long lock time after a frequency change. The present invention provides a substantial cost savings over conventional DC and low frequency FM modulators.

What is claimed is:

1. A method of generating an output signal having a pre-determined frequency shift relative to the frequency of a reference signal in a system comprising a digital phase-locked loop coupled to the reference signal for generating the output signal, the method comprising the steps of:

(a) adding pulses to the reference signal, the pulses recurring at a first cyclical rate; and
   (b) concurrently subtracting pulses from the reference signal at a second cyclical rate.

2. The method in accordance with claim 1, further comprising the step of
   (c) selecting the first and second cyclical rates to be greater than a rate determined by frequency response characteristics of the digital phase-locked loop.

3. The method in accordance with claim 1, wherein step (b) further comprises the step of
   (d) preventing a pulse subtraction from occurring simultaneously with a pulse addition.

4. The method in accordance with claim 1, further comprising the step of
   (e) selecting the first and second cyclical rates such that the arithmetic difference between the first and second rates is equal to the pre-determined frequency shift of the output signal divided by a frequency multiplying factor of the digital phase-locked loop.

5. The method in accordance with claim 1, further comprising the step of
   (f) synchronizing the first and second cyclical rates with the reference signal.

6. The method in accordance with claim 1, further comprising the step of
   (g) selecting the first and second cyclical rates such that first and second signals having the first and second cyclical rates will traverse an integer divisor of three-hundred-sixty degrees of phase difference relative to one another per cycle of the first signal.

7. The method in accordance with claim 6, further comprising the step of (h) selecting initial phase offset between the first and second signals to be one-half of the integer divisor determined in step (g).

8. The method in accordance with claim 6, further comprising the step of
   (i) selecting initial phase offset between the first and second signals to be one-quarter of the integer divisor determined in step (g).

9. An apparatus for generating an output signal having a pre-determined frequency shift relative to the frequency of a reference signal in a system comprising a digital phase-locked loop coupled to the reference signal for generating the output signal, the apparatus comprising:

pulse addition means coupled to the reference signal for adding pulses recurring at a first cyclical rate to the reference signal; and
   pulse subtraction means coupled to the reference signal for concurrently subtracting pulses at a second cyclical rate from the reference signal.

10. The apparatus in accordance with claim 9 further comprising first processing means coupled to the pulse addition means and to the pulse subtraction means for selecting the first and second cyclical rates to be greater than a rate determined by frequency response characteristics of the digital phase-locked loop.

11. The apparatus in accordance with claim 9 further comprising second processing means coupled to the pulse addition means and to the pulse subtraction means for determining values and phasing of the first and second cyclical rates to prevent simultaneous pulse addition and pulse subtraction.

12. The apparatus in accordance with claim 9 further comprising third processing means coupled to the pulse addition means and to the pulse subtraction means for selecting the first and second cyclical rates such that the arithmetic difference between the first and second rates is equal to the pre-determined frequency shift of the output signal divided by a frequency multiplying factor of the digital phase-locked loop.

13. The apparatus in accordance with claim 9 further comprising fourth processing means coupled to the pulse addition means and to the pulse subtraction means for selecting the first and second cyclical rates such that first and second signals having the first and second cyclical rates will traverse an integer divisor of three-hundred-sixty degrees of phase difference relative to one another per cycle of the first signal.

14. The apparatus in accordance with claim 13 further comprising fifth processing means coupled to the pulse addition means and to the pulse subtraction means for selecting initial phase offset between the first and second signals.

15. A wireless communication transmitter comprising a frequency synthesizer for generating an output signal having a pre-determined frequency shift relative to the frequency of a reference signal in the synthesizer comprising a digital phase-locked loop coupled to the reference signal for generating the output signal, the frequency synthesizer comprising:

a pulse adder coupled to the reference signal for adding pulses recurring at a first cyclical rate to the reference signal; and
   a pulse subtracter coupled to the reference signal for concurrently subtracting pulses at a second cyclical rate from the reference signal.

16. The wireless communication transmitter in accordance with claim 15 further comprising a first processing element coupled to the pulse adder and to the pulse subtracter for selecting the first and second cyclical rates to be greater than a rate determined by frequency response characteristics of the digital phase-locked loop.

17. The wireless communication transmitter in accordance with claim 15 further comprising a second processing element coupled to the pulse adder and to the pulse subtracter for determining values and phasing of the first and second cyclical rates to prevent simultaneous pulse addition and pulse subtraction.

18. The wireless communication transmitter in accordance with claim 15 further comprising a third processing element coupled to the pulse adder and to the pulse subtracter for selecting the first and second cyclical rates such that the arithmetic difference between the first and second cyclical rates is equal to the predetermined frequency shift of the output signal divided by a frequency multiplying factor of the digital phase-locked loop.

19. The wireless communication transmitter in accordance with claim 15 further comprising a fourth processing element coupled to the pulse adder and to the pulse subtracter for selecting the first and second cyclical rates such that first and second signals having the first and second cyclical rates will traverse an integer divisor of three-hundred-sixty degrees of phase difference relative to one another per cycle of the first signal.

20. The wireless communication transmitter in accordance with claim 19 further comprising a fifth processing element coupled to the pulse adder and to the pulse subtracter for selecting initial phase offset between the first and second signals.

* * * * *